United States Patent
Hwang et al.

(10) Patent No.: US 7,136,274 B2
(45) Date of Patent: Nov. 14, 2006

(54) EMBEDDED MULTILAYER PRINTED CIRCUIT

(75) Inventors: Lih-Tyng Hwang, Crystal Lake, IL (US); Robert B. Lempkowski, Elk Grove, IL (US); Li Li, Scottsdale, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/975,720

(22) Filed: Oct. 28, 2004

(65) Prior Publication Data
US 2006/0092594 A1    May 4, 2006

(51) Int. Cl.
*H01G 4/228* (2006.01)
(52) U.S. Cl. ............... 361/306.3; 361/306.1; 361/321.1; 361/767; 361/794; 174/52.2; 174/255; 174/260
(58) Field of Classification Search ........ 361/306.1, 361/306.3, 361.1, 361.3, 321.1; 174/255, 174/260, 52.2
See application file for complete search history.

(56) References Cited

U.S. PATENT DOCUMENTS 5,220,489 A * 6/1993 Barreto et al. .............. 361/783
6,448,873 B1 * 9/2002 Mostov ....................... 333/185
6,757,178 B1 * 6/2004 Okabe et al. ................ 361/793
6,834,380 B1 * 12/2004 Khazei ......................... 716/10
6,950,300 B1 * 9/2005 Sutardja .................... 361/306.3

OTHER PUBLICATIONS

Sutono, A.; Laskar, J.; Smith, W.R. "Design of Miniature Mulilayer On-Package Integrated Image-Reject Filters" IEEE Transactions on Microwave Theory and Techniques val. 51, No. 1 Jan. 2003.

* cited by examiner

*Primary Examiner*—Nguyen T. Ha (57) ABSTRACT

An embedded multilayer printed circuit includes a first ground plane (105, 1205, 1405) of a multilayer printed circuit board and an embedded layer. The embedded layer includes a co-planar capacitor (110, 1210, 1410), a distributed inductor (125, 1215, 1415), and a capacitive plate (135, 1220, 1420) circuit. The capacitive plate is a plate of a vertical capacitor (270, 1305, 1505). The embedded layer further includes a node (111, 1225, 1425) of the embedded multilayer printed circuit that is formed by a connection of a first terminal of the co-planar capacitor and a first terminal of the first distributed inductor, and in some embodiments, the first capacitive plate is also connected to the node. A second terminal of one of the co-planar capacitor and the distributed inductor is connected to the first ground plane.

16 Claims, 5 Drawing Sheets

EMBEDDED MULTILAYER PRINTED CIRCUIT

FIELD OF THE INVENTION

The present invention is generally in the field of passive electronic components that are formed from metal patterns in a layer of a printed circuit board, and in particular to combinations of passive components that can be formed within an inner layer of a printed circuit board.

BACKGROUND

A significant portion of the design effort for transceivers operating above 1 GHz is in the design of frequency filtering circuits, subcircuits, and filters. Low temperature co-fired cermics (LTCCs) have been used to implement these circuits due to desirable dielectric characteristics of LTCC, and vertical (between layer) capacitors have typically been used to achieve needed capacitances. However, LTCC is more expensive than organic multilayer printed circuit boards.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Before describing in detail the particular multilayer electronic circuit in accordance with the present invention, it should be observed that the present invention resides primarily in combinations of method steps and apparatus components related to multilayer printed circuits. Accordingly, the apparatus components and method steps have been represented where appropriate by conventional symbols in the drawings, showing only those specific details that are pertinent to understanding the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

The terms "including" and/or "having", as used herein, are defined as comprising. The term "coupled", as used herein with reference to electro-optical technology, is defined as connected, although not necessarily directly, and not necessarily mechanically.

Figure 1:
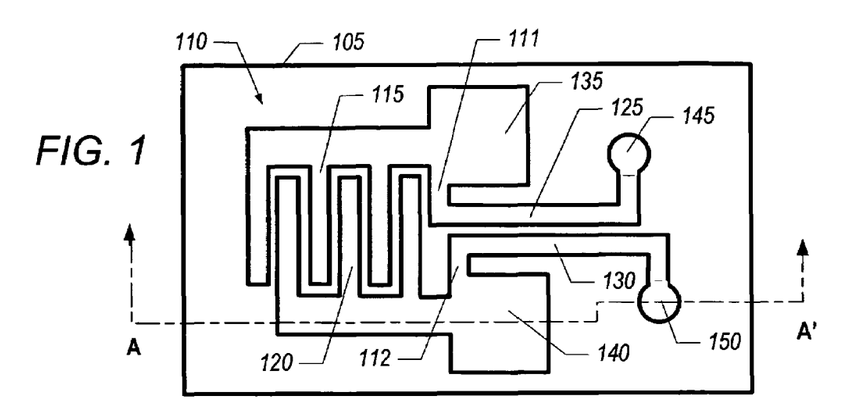
FIG. 1 shows a plan view of two patterned metal layers of a multilayer printed circuit, in accordance with some embodiments of the present invention.
Figure 2:
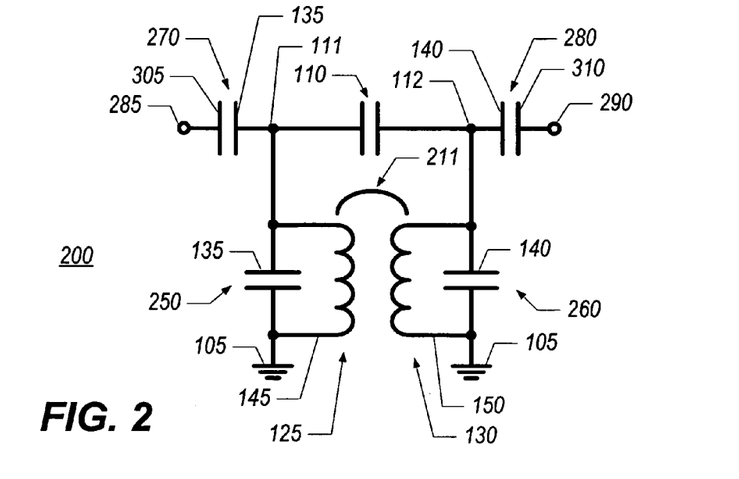
FIG. 2 shows an electrical schematic of a bandpass filter that includes electrical components illustrated in FIG. 1, in accordance with some embodiments of the present invention.

Referring to FIGS. 1 and 2, a plan view in FIG. 1 shows two patterned metal layers of a multilayer printed circuit fabricated in a portion of a multi-layer printed circuit board, and FIG. 2 shows an electrical schematic of a bandpass filter 200 that includes electrical components illustrated in FIG. 1, in accordance with some embodiments of the present invention. In terms of directions normally associated with plan views, a layer comprising (among other items), a co-planar capacitor 110 that itself comprises two multi-fingered patterns 115, 120, overlies a ground plane 105, which is called herein a first ground plane. The metal pattern of the first ground plane generally covers all of the area of a layer of the multilayer printed circuit board except for features such as isolated pads. (In the plan view drawings of this document, the material that separates the metal layers is omitted from the drawings. This material is a printed circuit dielectric, such as glass filled epoxy). The capacitance of the co-planar capacitor 110 is determined largely by the separation between the edges of the two multi-fingered patterns 115, 120, and the total length of the separation, as well as the dielectric constant of the material in the separation, as is known in the art. The layer comprising the co-planar capacitor 110 also may comprise a first plate pattern 135 (also called a first capacitive plate) and a second plate pattern 140 (also called a second capacitive plate), each of which forms one part of two vertical capacitors. A first vertical capacitor 250 (FIG. 2) is essentially formed by the first plate pattern 135 and a portion of the ground plane 105 that forms an opposing plate of the first vertical capacitor 250. A second vertical capacitor 260, (FIG. 2) is essentially formed by the second plate pattern 140 and a portion of the ground plane 105 that forms an opposing plate of the second vertical capacitor 260. The multilayer printed circuit in accordance with these embodiments may include the bandpass filter, which can be modeled by a schematic such as that shown in FIG. 2. Referring to both FIGS. 1 and 2, the bandpass filter may further comprise two distributed inductors 125, 130 that may be embodied in the same layer as the co-planar capacitor 110 and which may be designed to electromagnetically couple with each other over a frequency range. A desired capacitive value of the co-planar capacitor 110, a desired inductive value, and a mutual inductance 211 of the distributed inductors 125, 130 are typically determined during a design process. Dimensions of the co-planar capacitor are then determined to achieve those desired values using conventional modeling techniques, such as computer aided design, simulation, prototype analysis, etc. Thus, the physical dimensions and such things as the number of capacitive fingers will vary according to characteristics needed for the resulting bandpass filter, such as a resonant frequency and bandwidth. A resonant frequency (center frequency) of the bandpass filter is typically determined largely by the values of the distributed inductors 125, 130 and the first and second vertical capacitors. A transmission zero (or null) in the bandpass filter frequency response at a rejection frequency that is other than the resonant frequency is typically determined largely by the value of the co-planar capacitor 110 and the mutual inductance 211 of the distributed inductors 125, 130. The layer comprising the co-planar capacitor 110 and the distributed inductors 125, 130 is called for convenience herein the co-planar layer, even though this layer may in general include parts of vertical components and/or components used for purposes other than the circuits described herein, in a multilayer printed circuit board that contains other circuit functions. One of the distributed inductors 125 is called herein, for convenience, the first distributed inductor, and may be connected by a first terminal of the first distributed inductor 125 to a first terminal of the co-planar capacitor 110 at a node 111. Similarly, the second distributed inductor 130 may be connected by a first terminal of the second distributed inductor 130 to a second terminal of the co-planar capacitor 110 at a node 112. The first node 111 may be further connected to the first plate pattern 135, and the second node 112 may be further connected to the second plate pattern 140. Second terminals 145, 150 of the first and second distributed inductors 125, 130 may be connected to the first ground plane 105 by vias. The vias may be blind vias or through vias that contact one or more grounds, as will be further described with reference to FIGS. 7–9, below.

Figure 3:
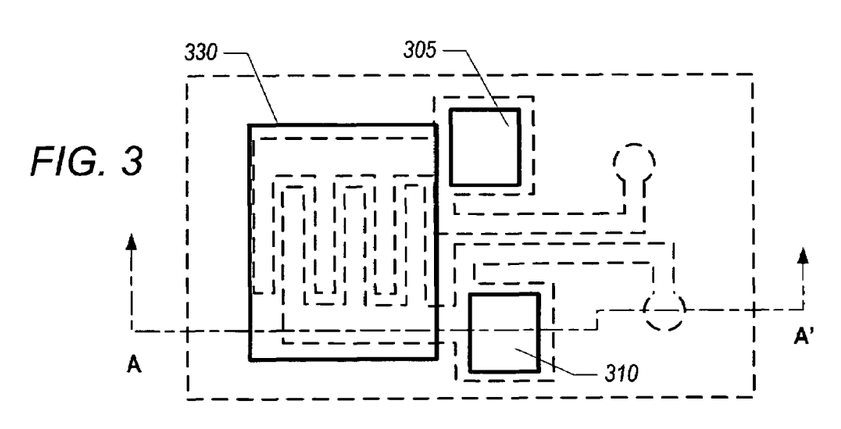
FIGS. 3 and 4 are plan views that show layers of the multilayer printed circuit, in accordance with some embodiments of the present invention.

Referring to FIG. 3, a plan view shows layers of the multilayer printed circuit fabricated in the portion of the multiplayer printed circuit board, in accordance with some embodiments of the present invention. The layers include a layer called herein the input/output (I/O) capacitor coupling layer, having metal patterns that are outlined by solid lines in FIG. 3. The I/O capacitor coupling layer overlies the two layers described above with reference to FIG. 1, which are outlined in dotted lines. Referring also to FIG. 2, the schematic of the bandpass filter 200 is shown, in accordance with some embodiments of the present invention. The I/O capacitor coupling layer may comprise an opposing plate pattern 305 of a third vertical capacitor 270 (FIG. 2), and an opposing plate pattern 310 of a fourth vertical capacitor 280 (FIG. 2). The opposing plate pattern of the third vertical capacitor 270 is on a side of the first plate pattern 135 opposite the first ground plane 105. Thus, the first plate pattern 135 is shared by the first and third vertical capacitors 270. Likewise, the opposing plate pattern of the fourth vertical capacitor 280 is on a side of the second plate pattern 140 opposite the first ground plane 105. Thus, the second plate pattern 140 is shared by the second and fourth vertical capacitors 260, 280. The third and fourth vertical capacitors 270, 280, are I/O capacitors that are designed to form desired input and output impedances, such as 50 ohms, at nodes 285 and 290, with reference to ground 105.

The I/O coupling capacitor layer may further comprise an isolated float plate 330, which is a metal pattern that may be essentially co-extensive with the co-planar capacitor. The float plate 330 may be positioned in the I/O coupling capacitor layer or another layer above, below, or above and below the co-planar layer, preferably with no metal patterns existing in any layer between the co-planar layer and the layer or layers containing the float plate 330. The float plate 330 is preferably not conductively connected to other circuits in the multilayer printed circuit board. The float plate 330 has been demonstrated to improve the depth of the transmission null of the bandpass filter at the rejection frequency by more than 10 dB, in a bandpass filter that resonates at a frequency of approximately 2.5 GHz in a design that has the float plate 330 located in the I/O coupling capacitor layer, and for which a layer over the I/O coupling capacitor layer is a second ground plane layer. The float plate 330 is described further with reference to FIGS. 5 and 6, below.

Figure 4:
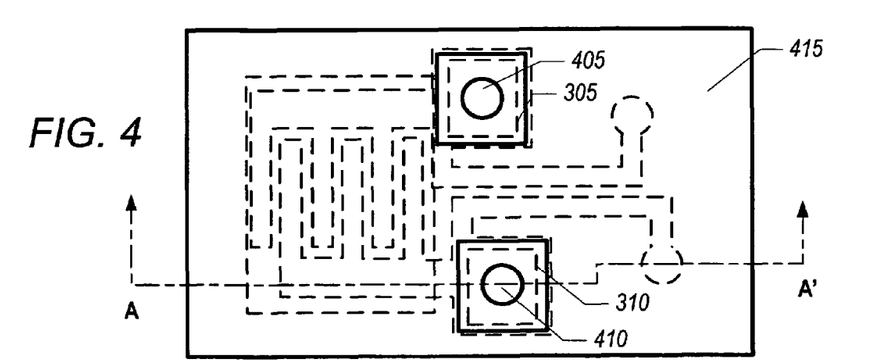

Referring to FIG. 4, a plan view shows layers of the multilayer printed circuit fabricated in the portion of a multiplayer printed circuit board, in accordance with some embodiments of the present invention. The layers include a layer called herein the second ground plane layer 415, having metal patterns that are outlined by solid lines in FIG. 4. The second ground plane layer 415 overlies the three layers described above with reference to FIGS. 1 and 3, which are outlined in dotted lines. Referring to both FIG. 4, the second ground plane layer 415 is a layer having an area that largely comprises metal. There may be cutouts that have isolated patterns 405, 410 to which the opposing plate patterns 305, 310 may be connected by blind or through vias to layers or components at the second ground plane layer 415 (or to a layer or layers above the second ground plane). The isolated patterns 405, 410, form nodes 285, 290 when connected to the opposing plate patterns 305, 310. When through vias are used, the first and second plate patterns will have a hole in them. The cutouts that include the isolated patterns 405, 410 may be of a size that is co-extensive with the opposing plate patterns 305, 310, to improve the performance of the bandpass filter. Nodes 285, 290 (FIG. 2) may be used to couple a radio frequency signal into and out of the bandpass filter 200. The second ground plane layer 415 may have some other cutouts for other functions.

In some embodiments, the values of the distributed inductors 125, 130 are approximately the same, the values of the first and second capacitors 250, 260 are approximately the same, and the values of the third and fourth capacitors 270, 280 are approximately the same; that is, the bandpass filter is a symmetrical bandpass filter.

Figure 5:
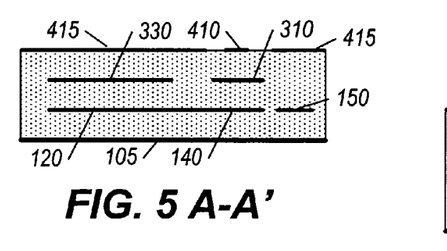
FIG. 5 is a cross sectional view of the portion of the multilayer printed circuit board illustrated in FIGS. 1, 3, and 4, in accordance with some embodiments of the present invention.

Referring to FIG. 5, a cross sectional view of the portion of the multilayer printed circuit board illustrated in FIGS. 1, 3, and 4 is shown, in accordance with some embodiments of the present invention. This view is shown without interlayer connections, and illustrates the float plate 330 located "above" the co-planar capacitor 110.

Figure 6:
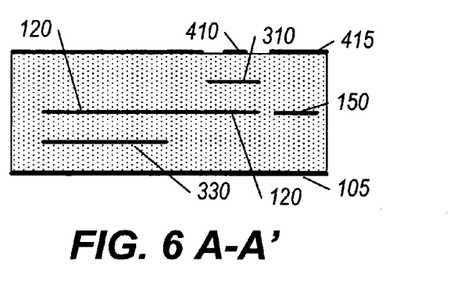
FIG. 6 is a cross sectional view of a portion of a multilayer printed circuit board, in accordance with some embodiments of the present invention.

Referring to FIG. 6, a cross sectional view of a portion of a multilayer printed circuit board is shown, in accordance with some embodiments of the present invention. This view is shown without interlayer connections. In these embodiments, the layer that includes the opposing plate pattern 310 does not include the float plate 330, but rather the float plate 330 is instead located between the co-planar capacitor 110 and the first ground plane 105. In yet another embodiment (not shown in the figures), two float plates are used, one "above" and one "below" the co-planar capacitor.

Figure 7:
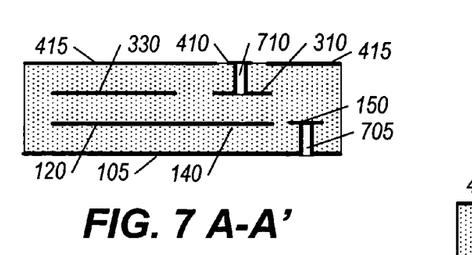
FIGS. 7, 8 and 9, are cross sectional views of the portion of the multilayer printed circuit board illustrated in FIGS. 1, 3, and 4, in accordance with some embodiments of the present invention.
Figure 8:
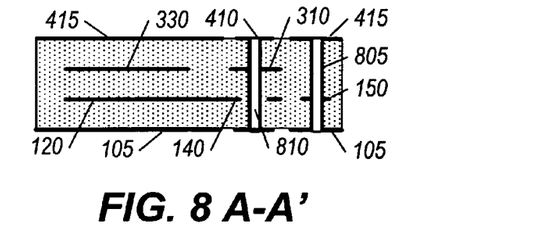
Figure 9:
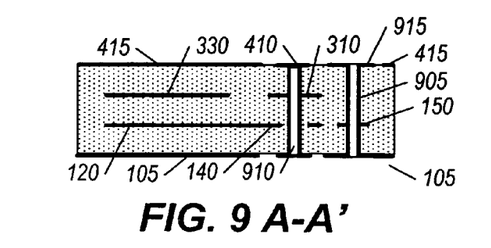

Referring to FIGS. 7, 8 and 9, three cross sectional views of the portion of the multilayer printed circuit board illustrated in FIGS. 1, 3, and 4 are shown, in accordance with some embodiments of the present invention. The views illustrate three methods of connecting the second capacitive plates 305, 310 of the vertical capacitors 270, 280 to the signal nodes 285, 290, which are at pads 405,410, and connecting second terminals 145, 150 of the first and second distributed inductors 125, 130 to one of the first and second ground planes 105, 415. Because the views in FIGS. 7–9 are cross sections, only the connections of the second capacitive plate 310 and second terminal 150 are visible. In FIG. 7, blind vias 705, 710 are used for these connections. In FIGS. 8 and 9, through vias 805, 810, 905, 910 are used. In FIG. 8 through vias are used (via 805 is visible in FIG. 8) that connect the second terminals 145, 150 of the distributed inductors 125, 130 to both ground planes 105, 415. In FIG. 9, through vias are used (via 905 is visible in FIG. 9) that connect the second terminals 145, 150 of the distributed inductors 125, 130 to the second ground plane 415, but terminate in isolated pads (isolated pad 915 is visible in FIG. 9) that are not connected to the first ground plane 105. The second capacitive plates 305, 310 are connected by through vias to isolated pads in the layers that include the first and second ground planes 105, 415 in both FIGS. 8 and 9 (through vias 810, 910 are visible in FIGS. 8 and 9). The connection technique illustrated in FIG. 8 is less expensive to fabricate than those in FIGS. 7 and 9, but has reduced electrical performance compared to those in those illustrated in FIGS. 7 and 9.

Figure 10:
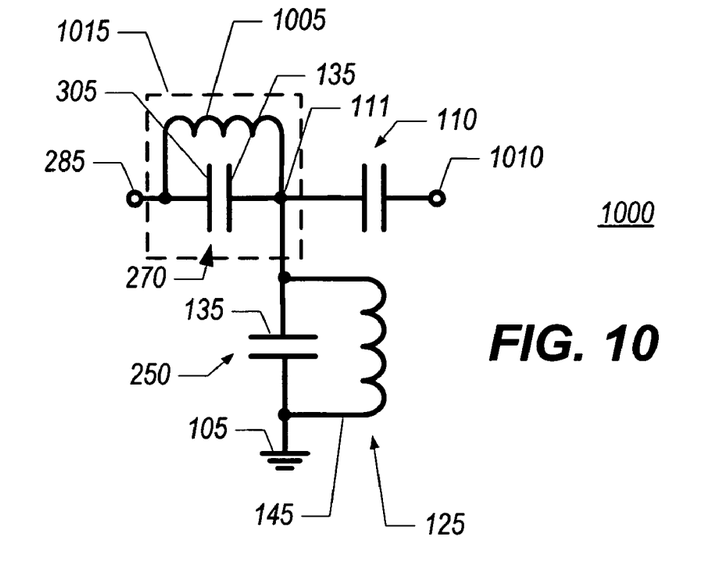
FIG. 10 is a schematic of other embedded multilayer printed circuits, in accordance with some embodiments of the present invention.

Referring to FIG. 10, a schematic of other embedded multilayer printed circuits 1000 is shown, in accordance with some embodiments of the present invention. While an essentially symmetrical bandpass filter has been described above with reference to FIGS. 1–4, the present invention can provide benefits for asymmetric filters or other reactive circuits. As can be observed in FIG. 10, these embedded multiplayer printed circuits 1000 comprise the first distributed inductor 125, the co-planar capacitor 110, and the first vertical capacitor 250 described above with reference to FIGS. 1–4, but do not include the second distributed inductor 130 nor the third vertical capacitor 260. In FIG. 10, the first distributed inductor 125 is connected to the first ground plane 105, the co-planar capacitor 110 is coupled to a signal node 1010, and a reactance 1015 is coupled to the signal node 285. Although both the third vertical capacitor 270 and an inductor 1005 are shown in FIG. 10, it will be appreciated that the present invention comprises any embedded reactance coupled between the nodes 111 and. The reactance 1015 may be used to couple a signal between node 285 and node 1010. When the inductor 1005 is included, it may be a single layer distributed type inductor or an embedded multi-layer type inductor, as are known in the art.

Figure 11:
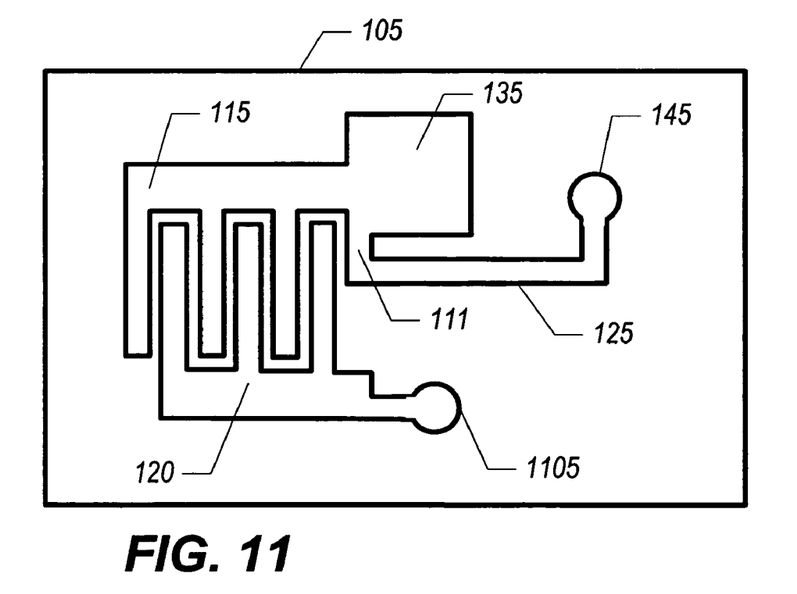
FIG. 11 is a plan view that shows layers of the multilayer printed circuits illustrated in FIG. 10, in accordance with some embodiments of the present invention.

Referring to FIG. 11, a plan view shows layers of the multilayer printed circuits 1000 fabricated in the portion of a multiplayer printed circuit board, in accordance with some embodiments of the present invention. The layers illustrated include the co-planar layer and the layer of the first ground plane 105, each having metal patterns that are outlined by solid lines in FIG. 11. The plan view illustrates a description of a basic form of the embedded multilayer printed circuits 1000, which comprises the first ground plane 105, the co-planar capacitor 110, the first distributed inductor 125, the first capacitive plate 135, and the first node 111. The first node is formed from a connection of a first terminal of the co-planar capacitor 110, a first terminal of the first distributed inductor 125, and the first capacitive plate 135. The first capacitive plate 135 is a capacitive plate of a vertical capacitor that may be the vertical capacitor 250 or the vertical capacitor 270, or it can be a capacitive plate for both, as illustrated with reference to FIGS. 1–4.

In this basic embodiment, one of a second terminal 1105 of the co-planar capacitor 110 and a second terminal 145 of the first distributed inductor 125 nay be connected to the first ground plane 105. The first node 111 of the embedded multilayer printed circuit may be coupled to one or more other layers of the multilayer printed circuit board by a first reactance 1015.

When the second terminal 145 of the first distributed inductor 125 is connected to the first ground plane 105 (as shown in FIG. 10), the second terminal 1105 of the co-planar capacitor 110 may be coupled to node 1010, which is a signal node. When the second terminal 1105 of the co-planar capacitor 110 is connected to the first ground plane 105 (which is not shown in a figure), the second terminal 145 of the distributed inductor 125 may be coupled to node 1010, which is again a signal node. In this configuration, the capacitance 250 will be formed between the first node 111 and the first ground plane 105. When this capacitance is undesirable, the metal in the area co-extensive with the first capacitive plate 135 on the first ground plane 105 may be removed, essentially eliminating capacitance 250.

These embodiments, like the ones described with reference to FIGS. 1–9, provide a very inexpensive and effective filter circuit for use in embedded printed circuits.

The metal plating of the layers that includes the co-planar capacitor 110, the first ground plane 105, the layer that includes the second capacitive plates 305, 310 of the vertical capacitors 270, 280, the float plate 330, and the second ground plane layer 415 may be any conductive metal typically used for multi-layer printed circuit board fabrication, such as copper, gold, silver, nickel, or any alloy thereof. The present invention has been demonstrated to work well using conventional organic multilayer printed circuit board material, such as the well known FR-4 type, but could be used with other materials such as low temperature co-fired ceramics. The co-planar capacitor 110, when embodied in an organic multilayer printed circuit board, may have a value that ranges from about 0.1 pF to about 2.0 pF, and the distributed inductors may have values that range from about 0.1 nH to about 5 nH. The first, second, third, and fourth vertical capacitors, 250, 260, 270, 280 may have values that range from about 0.1 pF to about 2.0 pF when the printed circuit dielectric between their plates is FR-4 and the printed circuit nominal dielectric layer thickness between their plates ranges from about 100 to about 250 micrometers.

Figures 12, 13:
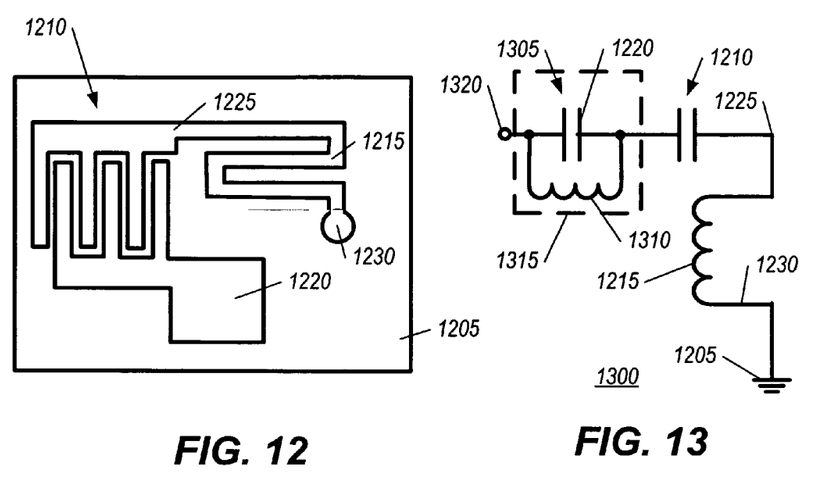
FIGS. 12 and 14 each show two patterned metal layers of a multilayer printed circuit fabricated in a portion of a multi-layer printed circuit board, in accordance with some embodiments of the present invention.
FIGS. 13 and 15 show electrical schematics of filters that include electrical components illustrated in FIGS. 12 and 14, in accordance with some embodiments of the present invention.
Figure 14:
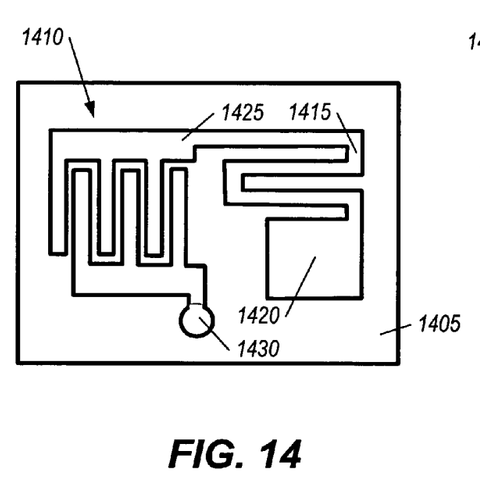
Figure 15:
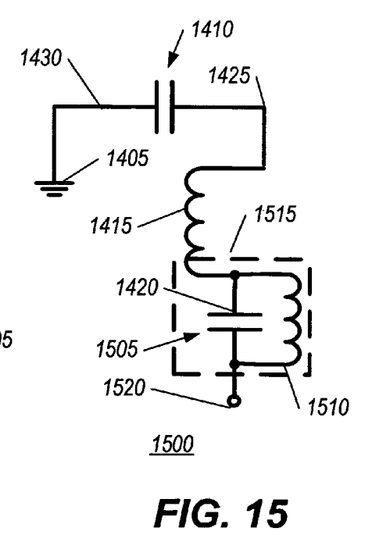

Referring to FIGS. 12–15, plan views in FIGS. 12 and 14 each show two patterned metal layers of a multilayer printed circuit fabricated in a portion of a multi-layer printed circuit board, and FIGS. 13 and 15 show electrical schematics of filters 1300, 1500 that include electrical components illustrated in FIGS. 12 and 14, in accordance with some embodiments of the present invention. The filters 1300, 1500 described with reference to FIGS. 12 and 13 are similar in many respects to the filters described with reference to FIGS. 13 and 15, so they common aspects are first described, together. As in FIG. 1, a co-planar capacitor 1210, 1410 that itself comprises two multi-fingered patterns, overlies a ground plane layer 1205, 1405, which is called herein a first ground plane layer. The co-planar capacitor 1210, 1410, a distributed inductor 1215, 1415, and a first capacitive plate 1220, 1420 are embedded within an inner layer of the multilayer printed circuit board. The first capacitive plate 1220, 1420 is a plate of a vertical capacitor 1305, 1505. A first node 1225, 1425 is formed by a connection of a first terminal of the distributed inductor 1215, 1415 and a first terminal of the co-planar capacitor 1210, 1410. In the embodiments described with reference to FIGS. 12 and 13, a second terminal of the first distributed inductor 1215 is connected to the first ground plane 1205. The second terminal of the co-planar capacitor 1210 is coupled to one or more other layers of the multilayer printed circuit board by a reactance 1315 that includes the vertical capacitor 1305. In the embodiments described with reference to FIGS. 14 and 15, a second terminal of the co-planar capacitor 1410 is connected to the first ground plane 1405. The second terminal of the first distributed inductor 1415 is coupled to one or more other layers of the multilayer printed circuit board by a reactance 1515 that includes the vertical capacitor 1505. The filters 1300, 1500 may further comprise one or two float plates, which may be fabricated relative to the co-planar capacitor 1210, 1410 in the same manner as described with reference to FIGS. 1–9 for the float plate 330 relative to co-planar capacitor 110. The first capacitive plate 1220, 1420 may form a vertical capacitor with a second capacitive plate fabricated in a layer between the layer that includes the co-planar capacitor 1210, 1410 and a second ground plane layer, in the same manner as the vertical capacitor 270 described with reference to FIGS. 1–9. The second plate may be coupled to an input/output signal node 1320, 1520. In some embodiments, he first capacitive plate 1220, 1420 may also form a second vertical capacitance with a co-extensive area of the first ground plane 1205, 1405. In the embodiments shown in FIGS. 12–15, the metal in the co-extensive area of the first ground plane 1205, 1405 is removed so that essentially no capacitance exists between the first capacitive plate 1220, 1420 and the first ground plane 1205, 1405. The electrical components described herein have the same range of values as those described for the corresponding components described with reference to FIGS. 1–9.

It will be appreciated that the present invention can be beneficially included in complicated systems that include, for example, a wireless telephone, an essentially complete optical or radio frequency receiver, transmitter, or transceiver, and can be included in any of a very wide variety of optoelectronic assemblies (i.e., those including either electronic or photonic circuits, or both), including consumer products such as portable music players and automobiles; military products such as communication units and communication control systems; and commercial equipment ranging from extremely complicated computers to robots to simple pieces of test equipment and "throwaway" wireless nodes for ad hoc systems, just to name a few types and classes of optoelectronic equipment.

Figure 16:
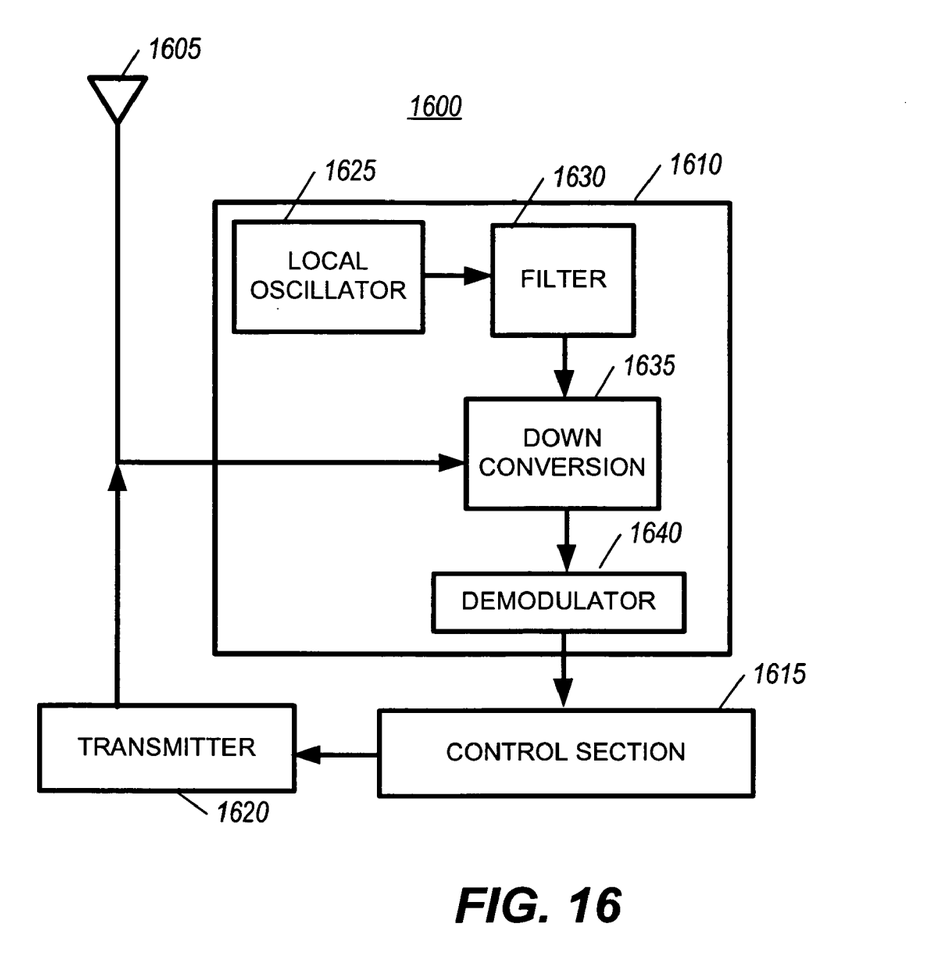
FIG. 16 shows an electrical clock diagram of an electronic device, in accordance with some embodiments of the present invention.

Referring to FIG. 16, an electrical clock diagram shows an electronic device 1600, in accordance with some embodiments of the present invention. The electronic device 1600 in this example is a personal communication device 1600 which may be a cellular telephone or a personal digital assistant that includes a cellular telephone, and which is but one example of the systems and equipment described above. The electronic device 1600 comprises an antenna 1605 that may intercept and radiate radio signals, and which may be as simple as a conductive runner printed on a multilayer printed circuit board. Intercepted radio signals are coupled to a receiver 1610 which receives the intercepted signal and couples demodulated information to a control section 1615. The control section comprises one or more processors and user interface devices (displays, buttons, speakers, etc.) and presents and manipulations information, and controls the formation of messages that may be encoded, modulated and transmitted by a transmitter 1620 that is also coupled to the antenna 1605. The intercepted signal is coupled to a down conversion circuit 1635. A local oscillator (LO) signal is generated by a local oscillator 1630 and the LO signal is filtered by filter 1630, which is a filter formed in a multilayer printed circuit board in accordance with the present invention, and may be a symmetric filter as described above with reference to FIGS. 1–9. The filtered LO signal is coupled to the down conversion circuit 1635, which generates an intermediate frequency signal that is coupled to a demodulator 1640. The demodulator 1640 generates a demodulated signal that is coupled to the control section, which extracts information from the demodulated signal. Filters according to the present invention may be used in other places within the receiver 1610, such as for intermediate frequency and front end filtering, decoupling filters, etc., as well as for filters in the transmitter 1620 and control section 1615. It will be appreciated that as a result of the space efficiency of the embedded circuits of the present invention, it may be practical to incorporate all the radio frequency filters for the electronic device 1600 in one printed circuit board, using a common co-planar layer. Although the present invention has been described in this paragraph as being used in an electronic device that manipulates radio frequency signals and has an antenna, it will be appreciated that the present invention may be useful in any electronic device having signals with radio frequencies, whether desired or undesired. For example, the present invention may be used to filter out undesirable RF frequencies from a signal at a signal node in equipment that has no antenna, such as a computer.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

It is further understood that the use of relational terms, if any, such as first and second, top and bottom, and the like may be used solely to distinguish one entity or action from another entity or action without necessarily requiring or implying any actual such relationship or order between such entities or actions.

What is claimed is:

1. An embedded multilayer printed circuit, comprising:
a first ground plane (105) of a multilayer printed circuit board;
a co-planar capacitor (110), a first distributed inductor (125), and a first capacitive plate (135) embedded within an inner layer of the embedded multilayer printed circuit, wherein the first capacitive plate is a plate of a first vertical capacitor (250 or 270); and a first node (111) formed by a connection of a first terminal of the co-planar capacitor, a first terminal of the first distributed inductor, and the first capacitive plate, wherein a second terminal (145) of one of the co-planar capacitor and the first distributed inductor is connected to the first ground plane, and wherein the first node of the embedded multilayer printed circuit is coupled to one or more other layers of the multilayer printed circuit board by a first reactance.

2. The embedded multilayer printed circuit according to claim 1, wherein the first reactance comprises the first vertical capacitor, which is formed from the first capacitive plate and an opposing plate (305) on a layer that is separated from the inner layer by essentially only printed circuit dielectric material.

3. The embedded multilayer printed circuit according to claim 1, wherein the co-planar capacitor has a value ranging from approximately 0.1 pF to 2 pF, the first distributed inductor has a value ranging from approximately 0.1 nH to 5 nH, and the first vertical capacitor has a value ranging from approximately 0.1 pF to 2 pF.

4. The embedded multilayer printed circuit according to claim 1, further comprising:

a second distributed inductor (130) and a second capacitive plate (140) embedded within the inner layer of the multilayer printed circuit board, wherein the second distributed inductor is arranged to electromagnetically couple to the first distributed inductor over a frequency band, and wherein the first capacitive plate is a plate of a second vertical capacitor (260 or 280); and a second node (112) of the embedded multilayer printed circuit that is formed by a connection of the second terminal of the co-planar capacitor, a first terminal of the second distributed inductor, and the second capacitive plate, and wherein second terminals of the first and second distributed inductors are connected to the first ground plane, and wherein the second node of the embedded multilayer printed circuit is coupled to one or more other layers of the multilayer printed circuit board by a second reactance.

5. The embedded multilayer printed circuit according to claim 4, wherein:

the first vertical capacitor comprises the first capacitive plate and a portion of the first ground plane that forms an opposing plate of the first capacitive plate;

the second vertical capacitor comprises the second capacitive plate and a portion of the first ground plane that forms an opposing plate of the second capacitive plate;

a third vertical capacitor (270) that comprises the first capacitive plate and an opposing plate (305) that is on a side of the first capacitive plate opposite the first ground plane, and is coupled to a first signal node (285) of the embedded multilayer printed circuit; and a fourth vertical capacitor (280) that comprises the second capacitive plate and an opposing plate pattern (310) that is on a side of the second capacitive plate opposite the first ground plane, and is coupled to a second signal node (290) of the embedded multilayer printed circuit.

6. The embedded multilayer printed circuit according to claim 5, wherein the values of the first, second, third, and fourth vertical capacitors are not necessarily equal and range from approximately 1 to 10 pF.

7. The embedded multilayer printed circuit according to claim 1, further comprising an isolated float plate (330) that is essentially co-extensive with the co-planar capacitor, wherein the isolated float plate is positioned in a layer between the coplanar capacitor (110) and one of the first ground plane and a second ground plane (105, 315).

8. The embedded multilayer printed circuit according to claim 7, further comprising a low loss dielectric material separating the isolated float plate from the co-planar capacitor.

9. The embedded multilayer printed circuit according to claim 1, wherein a second terminal of the one of the co-planar capacitor and the first distributed inductor is connected to the first ground plane by one of a blind via or a plated through via that is conductively isolated from all other ground planes of the multilayer printed circuit board.

10. The embedded multilayer printed circuit according to claim 1, wherein the multilayer printed circuit board is an organic circuit board having conductive metal patterned layers.

11. An embedded multilayer printed circuit, comprising:

a first ground plane (1205, 1405) of a multilayer printed circuit board;

a co-planar capacitor (1210, 1410), a distributed inductor (1215, 1415), and a capacitive plate (1220, 1420) embedded within an inner layer of the multilayer printed circuit board, wherein the capacitive plate is a plate of a vertical capacitor (1305, 1505); and a first node (1225, 1425) formed by a connection of a first terminal of the distributed inductor and a first terminal of the co-planar capacitor, wherein a second terminal of one of the co-planar capacitor and the distributed inductor is connected to the first ground plane, and wherein the second terminal of the other of the co-planar capacitor and the distributed inductor is coupled to one or more other layers of the multilayer printed circuit board by a reactance (1315, 1515) that includes the vertical capacitor.

12. The embedded multilayer printed circuit according to claim 11, wherein the vertical capacitor is formed from the capacitive plate and an opposing plate on a layer that is separated from the inner layer by essentially only printed circuit dielectric material.

13. The embedded multilayer printed circuit according to claim 11, wherein the co-planar capacitor has a value ranging from 0.1 pF to 2 pF and the distributed inductor has a value ranging from 0.1 nH to 5 nH, and the first vertical capacitor has a value ranging from approximately 0.1 pF to 2 pF.

14. The embedded multilayer printed circuit according to claim 11, further comprising an isolated float plate essentially co-extensive with the co-planar capacitor, wherein the isolated float plate is positioned in a layer between the co-planar capacitor and one of the first ground plane and a second ground plane.

15. An embedded multilayer printed circuit, comprising:

a ground plane of a multilayer printed circuit board;

a coplanar capacitor, a distributed inductor, and a capacitive plate embedded within an inner layer of the multilayer printed circuit board, wherein the capacitive plate is a plate of a vertical capacitor; and a first node formed by a connection of a first terminal of the distributed inductor and a first terminal of the co-planar capacitor, wherein a second terminal of one of the co-planar capacitor and the distributed inductor is connected to the first ground plane.

16. An electronic device, comprising:
- a signal node; and
- a filter that modifies a radio frequency signal conducted by the signal node, comprising a ground plane of a multilayer printed circuit board;
- a co-planar capacitor, a distributed inductor, and a capacitive plate embedded within an inner layer of the multilayer printed circuit board, wherein the capacitive plate is a plate of a vertical capacitor; and
- a first node formed by a connection of a first terminal of the distributed inductor and a first terminal of the co-planar capacitor,
- wherein a second terminal of one of the co-planar capacitor and the distributed inductor is connected to the first ground plane.

* * * * *